United States Patent
Ribeiro

(10) Patent No.: US 10,848,297 B1
(45) Date of Patent: Nov. 24, 2020

(54) QUADRATURE CLOCK SKEW CALIBRATION CIRCUIT

(71) Applicant: Texas Instruments Incorporated, Dallas, TX (US)

(72) Inventor: Roland Ribeiro, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/658,294

(22) Filed: Oct. 21, 2019

(51) Int. Cl.
*H04L 7/00* (2006.01)
*H03K 3/037* (2006.01)
*H03K 3/017* (2006.01)

(52) U.S. Cl.
CPC .......... *H04L 7/0037* (2013.01); *H03K 3/017* (2013.01); *H03K 3/037* (2013.01); *H04L 7/0087* (2013.01)

(58) Field of Classification Search
CPC ..... H04L 7/0037; H04L 7/0087; H03K 3/017; H03K 3/037
USPC ........................................................ 375/373
See application file for complete search history.

(56) References Cited

U.S. PATENT DOCUMENTS

2008/0298495 A1* 12/2008 Salvi .................... H04L 27/364
375/295

* cited by examiner

*Primary Examiner* — Kevin M Burd
(74) *Attorney, Agent, or Firm* — John R. Pessetto; Charles A. Brill; Frank D. Cimino

(57) ABSTRACT

A quadrature clock skew calibration circuit includes an I-Q clock generator having an input coupled to receive a first clock signal. The I-Q clock generator generates an in phase (I) clock signal and a quadrature (Q) clock signal. The quadrature clock skew calibration circuit includes an I-Q skew sensor having a first input coupled to receive the I clock signal and having a second input coupled to receive the Q clock signal. The I-Q skew sensor generates an I-Q skew signal responsive to a skew between the I and Q clock signals. The quadrature clock skew calibration circuit includes a control circuit having a first input coupled to receive the I-Q skew signal and having a second input coupled to receive a second clock signal. The control circuit varies the duty cycle of the first clock signal responsive to the I-Q skew signal and the second clock signal.

16 Claims, 3 Drawing Sheets

QUADRATURE CLOCK SKEW CALIBRATION CIRCUIT

BACKGROUND

The disclosure generally relates to quadrature clock skew calibration circuit.

DESCRIPTION OF THE RELATED ART

In high-speed asynchronous serial data links, a phase difference between the clock and data signals often becomes prominent during propagation. This is undesirable for many applications which require the clock and data signals to be in-phase for proper operations. A clock and data recovery (CDR) system may be used for accurate recovery of information from high-speed serial transmissions. In half-rate CDR systems, an accurate quadrature clock which outputs an in-phase (I) clock signal and a quadrature (Q) clock signal is required for CDR locking. If the phase between the I clock signal and the Q clock signal is not at a quadrature, the CDR system will be unable to lock close to the center of the incoming data, causing an error in a final CDR lock point which can lead to bit errors. Thus, it is necessary to calibrate the skew between the I clock signal and the Q clock signal. One approach to calibrate the skew between the I clock signal and the Q clock signal is incorporating tunable delay stages that can be adjusted to change the phase relationships of the I clock signal and the Q clock signal. However, tunable delay stages add delay cells in a circuit, which consume additional power and cause jitter. Furthermore, the calibration resolution is limited by the delay of each delay stage.

SUMMARY

Various aspects of the present disclosure are directed to a quadrature clock skew calibration circuit. In one aspect, the quadrature clock skew calibration circuit includes an I-Q clock generator having an input coupled to receive a first clock signal. The I-Q clock generator generates an in phase (I) clock signal and a quadrature (Q) clock signal at a half the input clock frequency. The quadrature clock skew calibration circuit further includes an I-Q skew sensor having a first input coupled to receive the I clock signal and having a second input coupled to receive the Q clock signal. The I-Q skew sensor generates an I-Q skew signal responsive to a skew between the I and Q clock signals. The quadrature clock skew calibration circuit also includes a control circuit having a first input coupled to receive the I-Q skew signal and having a second input coupled to receive a second clock signal. The control circuit varies the duty cycle of the first clock signal responsive to the I-Q skew signal and the second clock signal. The skew between the I and Q clock signals is calibrated by varying the duty cycle of the first clock signal.

In an additional aspect of the disclosure, the control circuit includes a first PMOS transistor and a first NMOS transistor each having a drain terminal, a source terminal and a gate terminal. The source terminal the first PMOS transistor is coupled to a voltage supply, the drain terminal of the first PMOS transistor is coupled to the drain terminal of the first NMOS transistor, the source terminal of the first NMOS transistor is coupled to ground, and the gate terminals of the first PMOS transistor and the first NMOS transistor are coupled to receive the second clock signal. The control circuit further includes a second PMOS transistor and a second NMOS transistor each having a drain terminal, a source terminal and a gate terminal. The source terminal of the second PMOS transistor is coupled to the voltage supply, the drain terminal of the second PMOS transistor is coupled to the drain terminal of the first PMOS transistor, and the gate terminal of the second PMOS transistor is coupled to receive a first gate signal. The drain terminal of the second NMOS transistor is coupled to the drain terminal of the first NMOS transistor, the source terminal of the second NMOS transistor is coupled to ground, and the gate terminal of the second NMOS transistor is coupled to receive a second gate signal. The control circuit also includes an inverting buffer having an input coupled to the drain terminal of the first PMOS transistor and the drain terminal of the first NMOS transistor.

In an additional aspect of the disclosure, the first PMOS transistor and the first NMOS transistor are coupled in an inverter configuration. Responsive to the second clock signal, the first PMOS transistor and the first NMOS transistor generate a third clock signal by inverting the second clock signal. The second clock signal has an inverse phase relationship with the third clock signal. The inverting buffer is coupled to receive the third clock signal. The inverting buffer generates the first clock signal by inverting the third clock signal which is applied to the I-Q generator. The first clock signal has an inverse phase relationship with the third clock signal.

In an additional aspect of the disclosure, the control circuit includes a processor having an input coupled to receive the I-Q skew signal. The processor generates a digital duty cycle control signal, a selection up signal and a selection down signal. The control circuit also includes a digital to analog converter (DAC) having an input coupled to receive the digital duty cycle control signal. The DAC outputs an analog duty cycle control signal. The control circuit also includes a first and a second multiplexer having respective inputs coupled to receive the analog duty cycle control signal. The first multiplexer responsive to the selection down signal applies the analog duty cycle control signal as the first gate signal to the gate terminal of the second PMOS transistor. The second multiplexer responsive to the selection up signal applies the analog duty cycle control signal as the second gate signal to the gate terminal of the second NMOS transistor.

In an additional aspect of the disclosure, responsive to the first gate signal the second PMOS transistor sources current into the output of the inverter to reduce the duty cycle of the first clock signal, and responsive to the second gate signal the second NMOS transistor sinks current from the output of the inverter to increase the duty cycle of the first clock signal.

In an additional aspect of the disclosure, the I-Q generator includes a first latch having an input, an output and a rising edge-triggered clock input coupled to receive the first clock signal. The I-Q generator also includes a second latch having an input, an output, an inverted output, and a falling edge-triggered clock input coupled to receive the first clock signal. The output of the first latch is coupled to the input of the second latch, and the inverted output of the second latch is coupled to the input of the first latch. The first latch generates the I clock signal responsive to a rising edge of the first clock signal. The second latch generates the Q clock signal responsive to the falling edge of the first clock signal.

In an additional aspect of the disclosure, the I-Q skew sensor includes a NAND gate having a first input coupled to receive the I clock signal and having a second input coupled to receive an inverted Q clock signal. The NAND gate outputs the I-Q skew signal.

In an additional aspect of the disclosure, a quadrature clock skew calibration circuit includes an I-Q clock generator having an input coupled to receive a first clock signal. The I-Q clock generator generates the I clock signal and the Q clock signal. The quadrature clock skew calibration circuit further includes an I-Q skew sensor having a first input coupled to receive the I clock signal and a having second input coupled to receive the Q clock signal. The I-Q skew sensor generates an I-Q skew signal responsive to a skew between the I and Q clock signals. The quadrature clock skew calibration circuit also includes a processor having an input coupled to receive the I-Q skew signal. The processor generates a digital duty cycle control signal, a selection up signal and a selection down signal. The quadrature clock skew calibration circuit also includes a duty cycle adjustment circuit having a first input coupled to receive the digital duty cycle control signal, a second input coupled to receive the selection up signal, and a third input coupled to receive the selection down signal. The duty cycle adjustment circuit varies the duty cycle of the first clock signal. The skew between the I and Q clock signals is calibrated by varying the duty cycle of the first clock signal.

In an additional aspect of the disclosure, the duty cycle adjustment circuit includes a digital to analog converter (DAC) having an input coupled to receive the digital duty cycle control signal. The DAC outputs an analog duty cycle control signal. The duty cycle adjustment circuit also includes a first and a second multiplexer having respective inputs coupled to receive the analog duty cycle control signal. The first multiplexer responsive to the selection down signal generates a first gate signal. The second multiplexer responsive to the selection up signal generates a second gate signal.

In an additional aspect of the disclosure, the duty cycle adjustment also includes a first and a second PMOS transistor having respective drain, source and gate terminals. The source terminals of the first and the second PMOS transistor are coupled to a voltage supply, the drain terminals of the first and the second PMOS transistor are coupled together, the gate terminal of the first PMOS transistor is coupled to receive a second clock signal, and the gate terminal of the second PMOS transistor is coupled to receive the first gate signal. The duty cycle adjustment circuit also includes a first and a second NMOS transistor having respective drain, source and gate terminals. The drain terminals of the first and the second NMOS transistor are coupled to the drain terminals of the first and the second PMOS transistor, the source terminals of the first and the second NMOS transistor are coupled to ground, the gate terminal of the first NMOS terminal is coupled to receive the second clock signal, and the gate terminal of the second NMOS terminal is coupled to receive the second gate signal. The duty cycle adjustment circuit also includes an inverting buffer having an input coupled to the drain terminal of the first PMOS transistor and coupled to the drain terminal of the first NMOS transistor. The first PMOS transistor and the first NMOS transistor are coupled in an inverter configuration. Responsive to the second clock signal, the first PMOS transistor and the first NMOS transistor generate a third clock signal by inverting the second clock signal. The third clock signal has an inverse phase relationship with the second clock signal. The inverting buffer is coupled to receive the third clock signal. The inverting buffer generates the first clock signal by inverting the third clock signal and applies the first clock signal to the I-Q generator. The first clock signal has an inverse phase relationship with the third clock signal. Responsive to the first gate signal the second PMOS transistor sources current to reduce the duty cycle of the first clock signal, and responsive to the second gate signal the second NMOS transistor sinks current to increase the duty cycle of the first clock signal.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
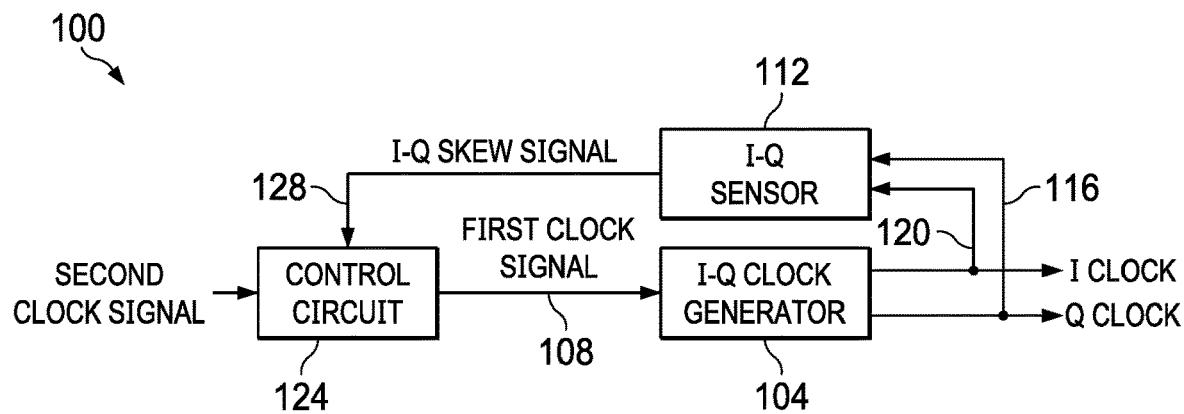
FIG. 1 is a block diagram of a quadrature clock skew calibration circuit in accordance with an exemplary embodiment.

FIG. 1 is a block diagram of a quadrature clock skew calibration circuit 100 in accordance with an exemplary embodiment. The quadrature clock skew calibration circuit 100 is configured to calibrate or adjust the skew between an in-phase (I) and a quadrature (Q) clock signal. The circuit 100 includes an I-Q clock generator 104 having an input 108 coupled to receive a first clock signal. The I-Q clock generator 104 generates the I clock signal and the Q clock signal responsive to the first clock signal. The circuit 100 also includes an I-Q skew sensor 112 having a first input 116 coupled to receive the I clock signal and a second input 120 coupled to receive the Q clock signal. The I-Q skew sensor 112 generates an I-Q skew signal responsive to the skew between the I clock signal and the Q clock signal. The circuit 100 also includes a control circuit 124 having a first input 128 coupled to receive the I-Q skew signal and a second input 132 coupled to receive a second clock signal. The control circuit 124 is configured to vary the duty cycle of the first clock signal responsive to the I-Q skew signal and the second clock signal. By varying the duty cycle of the first clock signal which drives the I-Q clock generator 104, the skew between the I and Q clock signals is calibrated.

Figure 2:
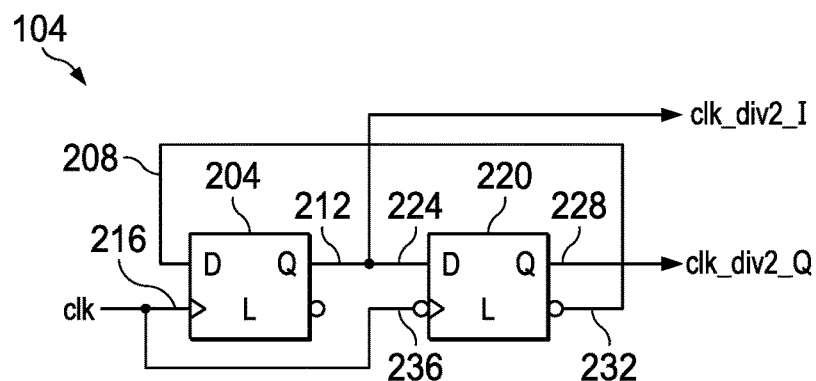
FIG. 2 illustrates an I-Q clock generator in accordance with an exemplary embodiment.

FIG. 2 illustrates the I-Q clock generator 104 in accordance with an exemplary embodiment. The quadrature circuit 104 can be realized with a divide by 2 circuit which outputs the I clock signal and the Q clock signal.

With reference to FIG. 2, the I-Q clock generator 104 includes a first latch 204 (e.g., master latch) having an input 208 (e.g., D input), an output 212 (e.g., Q output), and a rising edge-triggered clock input 216 coupled to receive the first clock signal. The I-Q clock generator 104 also includes a second latch 220 (e.g., slave latch) having an input 224 (e.g., D input), an output 228 (e.g., Q output), an inverted output 232, and a falling edge-triggered clock input 236 coupled to receive the first clock signal. The output 212 (Q output) of the first latch 204 is fed to the input 224 (D input) of the second latch 220, and the inverted output 232 of the second latch 220 is fed back to the input 208 (D input) of the first latch 204. The I-Q clock generator 104 produces the I clock signal at the output 212 and produces the Q clock signal at the output 228.

Figure 3:
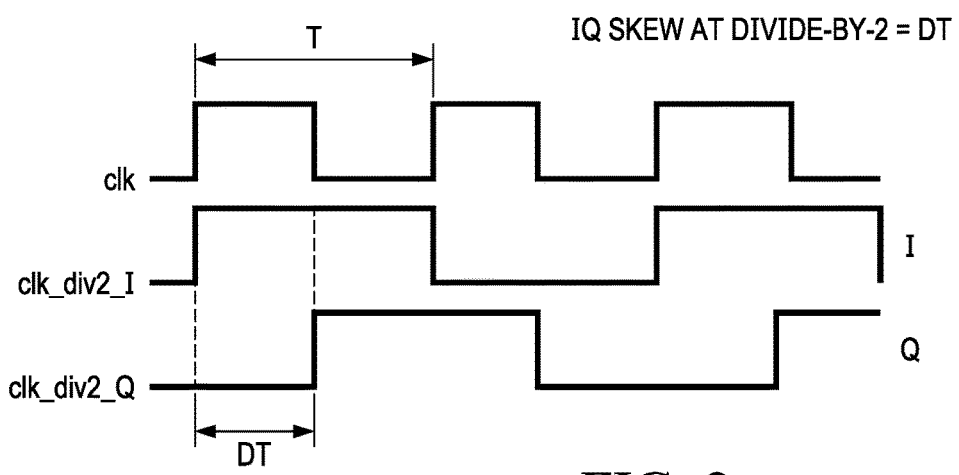
FIG. 3 is a timing diagram illustrating a first clock signal, an I clock signal and a Q clock signal.

FIG. 3 is a timing diagram illustrating the first clock signal, the I clock signal and the Q clock signal. At each rising edge of the first clock signal, the I clock signal flips states, and at each falling edge of the first clock signal, the Q clock signal flips states. Thus, the I-Q clock generator 104 produces the I and Q clock signals each having 2 times lesser frequency as compared to the first clock signal.

Figure 4:
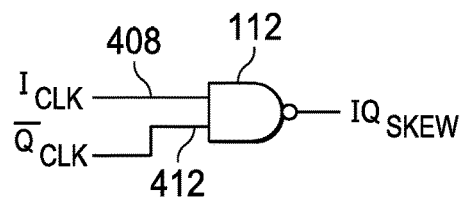
FIG. 4 illustrates an I-Q skew sensor in accordance with an exemplary embodiment.
Figure 5:
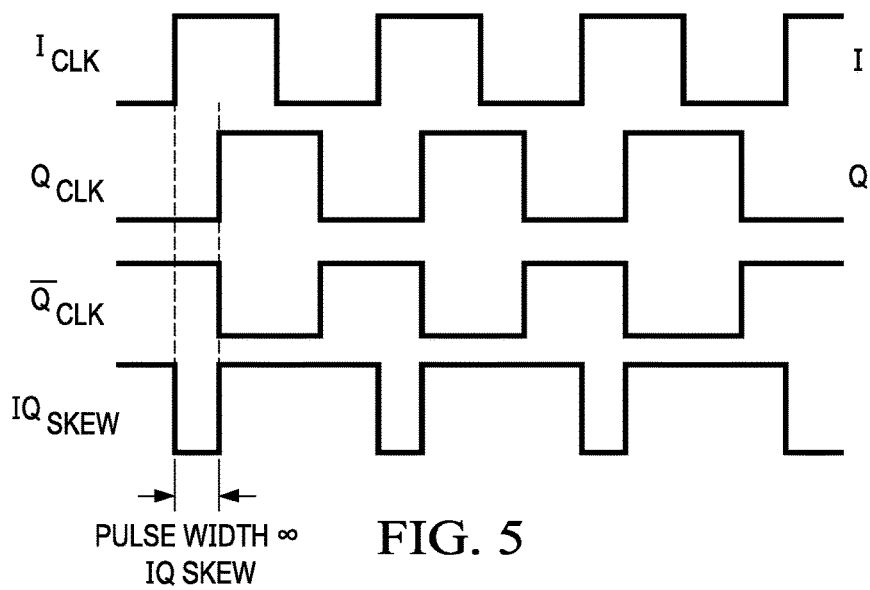
FIG. 5 illustrates an I-Q skew signal.

FIG. 4 illustrates the I-Q skew sensor 112 in accordance with an exemplary embodiment. The I-Q skew sensor 112 can be realized with combinational logic using a NAND gate 404 having a first input 408 to which is applied the I clock signal, and having a second input 412 to which is applied the inverted Q clock signal. As shown in the timing diagram of FIG. 5, a NAND operation between the I clock signal and the inverted Q clock signal produces a low pulse whose width is proportional to the skew between the I and Q clock signals.

Figure 6:
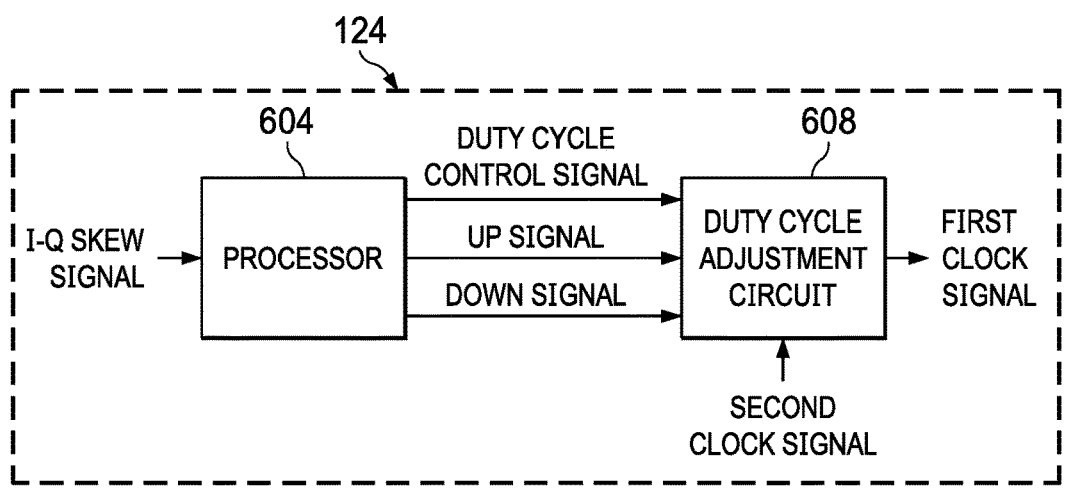
FIG. 6 illustrates a control circuit in accordance with an exemplary embodiment.

As discussed before, the control circuit 124 is configured to vary the duty cycle of the first clock signal in order to calibrate the skew between the/and Q clock signals. FIG. 6 illustrates the control circuit 124 in accordance with an exemplary embodiment. The control circuit 124 includes a processor 604 which receives the I-Q skew signal from the I-Q sensor 112. Responsive to the I-Q skew signal, the processor 604 outputs a digital duty cycle control signal. In addition, depending on the whether the duty cycle of the first clock needs to be calibrated downward (i.e., decreased) or calibrated upward (i.e., increased) the processor 604 outputs a selection up signal or a selection down signal. As an example, if the duty cycle of the first clock signal needs to be decreased, the selection down signal can be in a HIGH state while the selection down signal can be in a LOW state. On the other hand, if the duty cycle of the first clock signal needs to be increased, the selection up signal can be in a HIGH state while the selection down signal can be in a LOW state.

Variations to the control circuit 124 are possible within the scope of the disclosure. For example, a finite state machine can be used instead of the processor 604. The finite state machine can be realized in hardware or in software. The finite state machine can be defined by an initial state and conditions for each transition. In response to a change in the I-Q skew signal, the finite state machine will transition from one state to the next, and thus vary the three outputs: the digital duty cycle control signal, the selection up signal (HIGH or LOW), and the selection down signal (HIGH or LOW).

The control circuit 124 also includes a duty cycle adjustment circuit 608. The duty cycle adjustment circuit 608 has a first input 612 coupled to receive the digital duty cycle control signal, a second input 616 coupled to receive the selection up signal, a third input 620 coupled to receive the selection down signal, and a fourth input 624 coupled to receive a second clock signal, and responsive to the input signals the duty cycle adjustment circuit 608 varies the duty cycle of the first clock signal.

Figure 7:
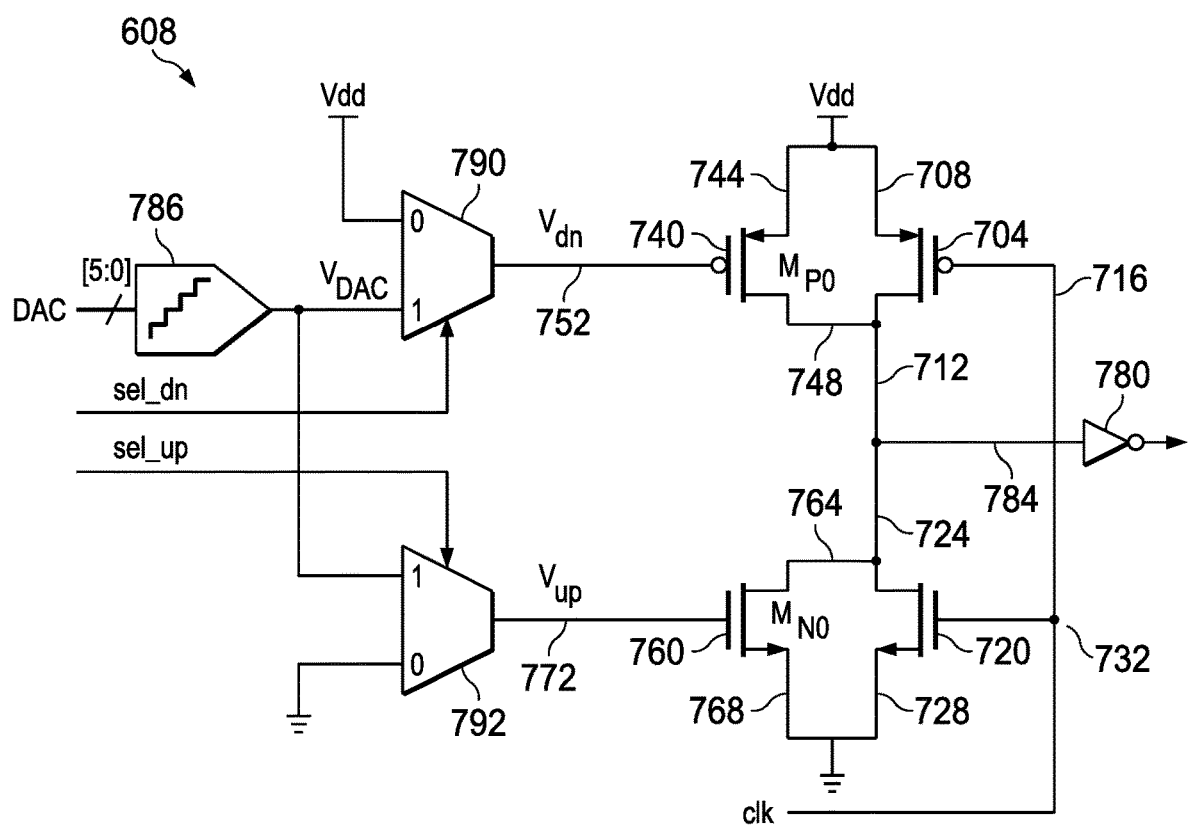
FIG. 7 illustrates a duty cycle adjustment circuit in accordance with an exemplary embodiment.

FIG. 7 illustrates the duty cycle adjustment circuit 608 in accordance with an exemplary embodiment. The duty cycle adjustment circuit 608 includes a first PMOS transistor 704 having a source terminal 708, a drain terminal 712 and a gate terminal 716. The circuit 608 also includes a first NMOS transistor 720 having a drain terminal 724, a source terminal 728 and a gate terminal 732. The source terminal 708 of the first PMOS transistor 704 is coupled to a voltage supply, the drain terminal 712 of the first PMOS transistor 704 is coupled to the drain terminal 724 of the first NMOS transistor 720, the source terminal 728 of the first NMOS transistor 720 is coupled to ground, and the gate terminals 716, 732 of the first PMOS transistor 704 and the first NMOS transistor are coupled to receive the second clock signal.

With continuing reference to FIG. 7, when the second clock signal transitions to a HIGH state, the NMOS transistor 720 is turned ON and the PMOS transistor 704 is turned OFF. When the second clock signal transitions to a LOW state, the PMOS transistor 704 is turned ON and the NMOS transistor 720 is turned OFF. Thus, the first PMOS transistor 704 and the first NMOS transistor 720 can be considered as being coupled in an inverter configuration having an output at the drain terminals 712 and 724. As a result, a third clock signal appearing at the drain terminals 712 and 724 has an inverse phase relationship to the second clock signal. An inverting buffer 780 has an input 784 coupled to receive the third clock signal. The inverting buffer 780 outputs the first clock signal by inverting the third clock signal, and the first clock signal is applied to the I-Q generator.

With continuing reference to FIG. 7, the circuit 608 also includes a second PMOS transistor 740 having a source terminal 744, a drain terminal 748 and a gate terminal 752. The source terminal 744 of the second PMOS transistor 740 is coupled to the voltage supply, the drain terminal 748 of the second PMOS transistor 740 is coupled to the drain terminal 712 of the first PMOS transistor 704, and the gate terminal 752 of the second PMOS transistor 740 is coupled to receive a first gate signal. The circuit 608 also includes a second NMOS transistor 760 having a drain terminal 764, a source terminal 768 and a gate terminal 772. The drain terminal 764 of the second NMOS transistor 760 is coupled to the drain terminal 724 of the first NMOS transistor 720, the source terminal 768 of the second NMOS transistor 760 is coupled to ground, and the gate terminal 772 of the second NMOS transistor 760 is coupled to receive a second gate signal.

With continuing reference to FIG. 7, the duty cycle of the first clock signal is varied by sourcing bleed current into, and sinking bleed current from, the output of the inverter formed by the first PMOS transistor 704 and the first NMOS transistor 720. More specifically, the second PMOS transistor 740 sources current to reduce the duty cycle of the first clock signal while the second NMOS transistor 760 sinks current to increase the duty cycle of the first clock signal.

With continuing reference to FIG. 7, the circuit 608 also includes a digital to analog converter (DAC) 786 having an input 788 coupled to receive the digital duty cycle control signal. The DAC 786 generates an analog duty cycle control signal which is multiplexed between the PMOS transistor 740 and the NMOS transistor 760. If the processor 604 determines that the duty cycle needs to be the processor 604 outputs the selection down signal having a HIGH state. Responsive to the HIGH state of the selection down signal, a first multiplexer 790 applies the analog duty cycle control signal (as the first gate signal) to the gate terminal 752 of the second PMOS transistor 740, thereby decreasing the duty cycle of the first clock signal. If the processor 604 determines that the duty cycle needs to be increased, the processor 604 outputs the selection up signal having a HIGH state.

Responsive to the HIGH state of the selection up signal, a second multiplexer 792 applies the analog duty cycle control signal (as the second gate signal) to the gate terminal 772 of the second NMOS transistor 760, thereby increasing the duty cycle of the first clock signal. Thus, the DAC 786, is multiplexed between the PMOS transistor 740 and the NMOS transistor 760 depending on whether the duty cycle needs to be decreased or increased.

Variations to the processor 604 are possible within the scope of the disclosure. For example, if the processor 604 determines that the duty cycle needs to be decreased, the processor 604 may enable the selection down signal and disable the selection up signal, and if the processor 604 determines that the duty cycle needs to be increased, the processor 604 may enable the selection up signal and disable the selection down signal.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A quadrature clock skew calibration circuit, comprising:
   an I-Q clock generator having an input coupled to receive a first clock signal and configured to generate an in phase (I) clock signal and a quadrature (Q) clock signal;
   an I-Q skew sensor having a first input coupled to receive the I clock signal and having a second input coupled to receive the Q clock signal, the I-Q skew sensor configured to generate an I-Q skew signal responsive to a skew between the I and the Q clock signal; and
   a control circuit having a first input coupled to receive the I-Q skew signal and having a second input coupled to receive a second clock signal, the control circuit configured to vary the duty cycle of the first clock signal,
   wherein the skew between the I and the Q clock signal is calibrated by varying the duty cycle of the first clock signal;
   wherein the control circuit comprises:
   a first PMOS transistor and a first NMOS transistor each having a drain terminal, a source terminal and a gate terminal, the source terminal of the first PMOS transistor coupled to a voltage supply, the drain terminal of the first PMOS transistor coupled to the drain terminal of the first NMOS transistor, the source terminal of the first NMOS transistor coupled to ground, and the gate terminals of the first PMOS transistor and the first NMOS transistor coupled to receive the second clock signal;
   a second PMOS transistor and a second NMOS transistor each having a drain terminal, a source terminal and a gate terminal, the source terminal of the second PMOS transistor coupled to the voltage supply, the drain terminal of the second PMOS transistor coupled to the drain terminal of the first PMOS transistor, the gate terminal of the second PMOS transistor coupled to receive a first gate signal, the drain terminal of the second NMOS transistor coupled to the drain terminal of the first NMOS transistor, the source terminal of the second NMOS transistor coupled to ground, and the gate terminal of the second NMOS transistor coupled to receive a second gate signal; and
   an inverting buffer having an input coupled to the drain terminal of the first PMOS transistor and the drain terminal of the first NMOS transistor.

2. The quadrature clock skew calibration circuit of claim 1, wherein the first PMOS transistor and the first NMOS transistor are coupled in an inverter configuration, and wherein the first PMOS transistor and the first NMOS transistor are configured to generate a third clock signal by inverting the second clock signal, wherein the second clock signal has an inverse phase relationship with the third clock signal.

3. The quadrature clock skew calibration circuit of claim 2, wherein the inverting buffer is coupled to receive the third clock signal and configured to generate the first clock signal by inverting the third clock signal and to apply the first clock signal to the I-Q generator, and wherein the first clock signal has an inverse phase relationship with the third clock relationship.

4. A quadrature clock skew calibration circuit, comprising:
   an I-Q clock generator having an input coupled to receive a first clock signal and configured to generate an in phase (I) clock signal and a quadrature (Q) clock signal;
   an I-Q skew sensor having a first input coupled to receive the I clock signal and having a second input coupled to receive the Q clock signal, the I-Q skew sensor configured to generate an I-Q skew signal responsive to a skew between the I and the Q clock signal; and
   a control circuit having a first input coupled to receive the I-Q skew signal and having a second input coupled to receive a second clock signal, the control circuit configured to vary the duty cycle of the first clock signal,
   wherein the skew between the I and the Q clock signal is calibrated by varying the duty cycle of the first clock signal;
   wherein the control circuit further comprises:
   a processor having an input coupled to receive the I-Q skew signal and configured to generate a digital duty cycle control signal, a selection up signal and a selection down signal;
   a digital to analog converter having an input coupled to receive the digital duty cycle control signal and configured to generate an analog duty cycle control signal;
   a first and a second multiplexer having respective inputs coupled to receive the analog duty cycle control signal,
   the first multiplexer responsive to the selection down signal configured to apply the analog duty cycle control signal as the first gate signal to the gate terminal of the second PMOS transistor,
   the second multiplexer responsive to the selection up signal configured to apply the analog duty cycle control signal as the second gate signal to the gate terminal of the second NMOS transistor.

5. The quadrature clock skew calibration circuit of claim 4, wherein responsive to the first gate signal the second PMOS transistor sources current to reduce the duty cycle of the first clock signal, and wherein responsive to the second gate signal the second NMOS transistor sinks current to increase the duty cycle of the first clock signal.

6. A quadrature clock skew calibration circuit, comprising:
- an I-Q clock generator having an input coupled to receive a first clock signal and configured to generate an in phase (I) clock signal and a quadrature (Q) clock signal;
- an I-Q skew sensor having a first input coupled to receive the I clock signal and having a second input coupled to receive the Q clock signal, the I-Q skew sensor configured to generate an I-Q skew signal responsive to a skew between the I and the Q clock signal; and
- a control circuit having a first input coupled to receive the I-Q skew signal and having a second input coupled to receive a second clock signal, the control circuit configured to vary the duty cycle of the first clock signal,
- wherein the skew between the I and the Q clock signal is calibrated by varying the duty cycle of the first clock signal;
- wherein the I-Q skew sensor comprises a NAND gate having a first input coupled to receive the I clock signal and having a second input coupled to receive an inverted Q clock signal, the NAND gate configured to generate the I-Q skew signal.

7. A quadrature clock skew calibration circuit, comprising:
- an I-Q clock generator having an input coupled to receive a first clock signal and configured to generate an in phase (I) clock signal and a quadrature (Q) clock signal;
- an I-Q skew sensor having a first input coupled to receive the I clock signal and a having second input coupled to receive the Q clock signal, the I-Q skew sensor configured to generate an I-Q skew signal responsive to a skew between the I and Q clock signals;
- a processor having an input coupled to receive the I-Q skew signal and configured to generate a digital duty cycle control signal, a selection up signal and a selection down signal; and
- a duty cycle adjustment circuit having a first input coupled to receive the digital duty cycle control signal, a second input coupled to receive the selection up signal, and a third input coupled to receive the selection down signal, the duty cycle adjustment circuit configured to vary the duty cycle of the first clock signal,
- wherein the skew between the I and Q clock signals is calibrated by varying the duty cycle of the first clock signal;
- wherein the duty cycle adjustment circuit comprises:
- a digital to analog converter having an input coupled to receive the digital duty cycle control signal and configured to generate an analog duty cycle control signal; and
- a first and a second multiplexer having respective inputs coupled to receive the analog duty cycle control signal, the first multiplexer responsive to the selection down signal configured to generate a first gate signal, the second multiplexer responsive to the selection up signal configured to generate a second gate signal.

8. The quadrature clock skew calibration circuit of claim 7, wherein the duty cycle adjustment circuit comprises:
- a first and a second PMOS transistor having respective drain, source and gate terminals, the source terminals of the first and the second PMOS transistor coupled to a voltage supply, the drain terminals of the first and the second PMOS transistor coupled together, the gate terminal of the first PMOS transistor coupled to receive a second clock signal, the gate terminal of the second PMOS transistor coupled to receive the first gate signal;
- a first and a second NMOS transistor having respective drain, source and gate terminals, the drain terminals of the first and the second NMOS transistor coupled to the drain terminals of the first and the second PMOS transistor, the source terminals of the first and the second NMOS transistor coupled to ground, the gate terminal of the first NMOS terminal coupled to receive the second clock signal, the gate terminal of the second NMOS terminal coupled to receive the second gate signal; and
- an inverting buffer having an input coupled to the drain terminal of the first PMOS transistor and coupled to the drain terminal of the first NMOS transistor.

9. The quadrature clock skew calibration circuit of claim 8, wherein the first PMOS transistor and the first NMOS transistor are coupled in an inverter configuration, and wherein responsive to the second clock signal, the first PMOS transistor and the first NMOS transistor are configured to generate a third clock signal by inverting the second clock signal, wherein the third clock signal has an inverse phase relationship with the second clock signal.

10. The quadrature clock skew calibration circuit of claim 9, wherein the inverting buffer is coupled to receive the third clock signal and configured to generate the first clock signal by inverting the third clock signal and to apply the first clock signal to the I-Q generator, and wherein the first clock signal has an inverse phase relationship with the third clock signal.

11. The quadrature clock skew calibration circuit of claim 8, wherein responsive to the first gate signal the second PMOS transistor sources current to reduce the duty cycle of the first clock signal, and wherein responsive to the second gate signal the second NMOS transistor sinks current to increase the duty cycle of the first clock signal.

12. A quadrature clock skew calibration circuit, comprising:
- an I-Q clock generator having an input coupled to receive a first clock signal and configured to generate an in phase (I) clock signal and a quadrature (Q) clock signal;
- an I-Q skew sensor having a first input coupled to receive the I clock signal and a having second input coupled to receive the Q clock signal, the I-Q skew sensor configured to generate an I-Q skew signal responsive to a skew between the I and Q clock signals;
- a processor having an input coupled to receive the I-Q skew signal and configured to generate a digital duty cycle control signal, a selection up signal and a selection down signal; and
- a duty cycle adjustment circuit having a first input coupled to receive the digital duty cycle control signal, a second input coupled to receive the selection up signal, and a third input coupled to receive the selection down signal, the duty cycle adjustment circuit configured to vary the duty cycle of the first clock signal,
- wherein the skew between the I and Q clock signals is calibrated by varying the duty cycle of the first clock signal;
- wherein the I-Q skew sensor comprises a NAND gate having a first input coupled to receive the I clock signal and having a second input coupled to receive an inverted Q clock signal, the NAND gate configured to generate the I-Q skew signal.

13. A quadrature clock skew calibration circuit, comprising:

an I-Q clock generator having an input coupled to receive a first clock signal and configured to generate an in phase (I) clock signal and a quadrature (Q) clock signal;

an I-Q skew sensor having a first input coupled to receive the I clock signal and a second input coupled to receive the Q clock signal, the I-Q skew sensor configured to generate an I-Q skew signal responsive to a skew between the I and Q clock signals;

a processor having an input coupled to receive the I-Q skew signal and configured to generate a digital duty cycle control signal, a selection up signal and a selection down signal;

a digital to analog converter having an input coupled to receive the digital duty cycle control signal and configured to generate an analog duty cycle control signal;

a first and a second multiplexer having respective inputs coupled to receive the analog duty cycle control signal, the first multiplexer responsive to the selection down signal configured to generate a first gate signal, the second multiplexer responsive to the selection up signal configured to generate a second gate signal;

a first and a second transistor coupled in an inverter configuration and having respective gate terminals coupled to receive a second clock signal, the first and second transistors configured to generate a third clock signal by inverting the second clock signal;

an inverting buffer having an input coupled to receive the third clock signal, the inverting buffer configured to generate the first clock signal by inverting the third clock signal;

a third transistor coupled to the first transistor and having a gate terminal coupled to receive the first gate signal; and a fourth transistor coupled to the second transistor and having a gate terminal coupled to receive the second gate signal, wherein the third transistor responsive to the first gate signal sources current to decrease the duty cycle of the first clock signal, and wherein the fourth transistor responsive to the second gate signal sinks current to increase the duty cycle of the first clock signal.

14. The quadrature clock skew calibration circuit of claim 13, wherein the first and third transistors are PMOS transistors, and wherein the second and fourth transistors are NMOS transistors.

15. The quadrature clock skew calibration circuit of claim 13, wherein the I-Q generator comprises:

a first latch having an input, an output and a rising edge-triggered clock input coupled to receive the first clock signal;

a second latch having an input, an output, an inverted output, and a falling edge-triggered clock input coupled to receive the first clock signal, the output of the first latch coupled to the input of the second latch, and the inverted output of the second latch coupled to the input of the first latch, the first latch configured to output the I clock signal responsive to a rising edge of the first clock signal, the second latch configured to output the Q clock signal responsive to the falling edge of the first clock signal.

16. The quadrature clock skew calibration circuit of claim 13, wherein the I-Q skew sensor comprises a NAND gate having a first input coupled to receive the I clock signal and having a second input coupled to receive an inverted Q clock signal, the NAND gate configured to generate the I-Q skew signal.

* * * * *